United States Patent [19]
Morisaki

[11] Patent Number: 5,455,531
[45] Date of Patent: Oct. 3, 1995

[54] FLIP-FLOP CIRCUIT

[75] Inventor: Shigeki Morisaki, Tokyo, Japan

[73] Assignee: NEC Corporation, Tokyo, Japan

[21] Appl. No.: 260,822

[22] Filed: Jun. 16, 1994

[30] Foreign Application Priority Data

Jun. 17, 1993 [JP] Japan .................................. 5-146148

[51] Int. Cl.⁶ .................................................. H03K 3/289
[52] U.S. Cl. ......................... 327/199; 327/200; 327/201; 327/202; 327/203
[58] Field of Search ........................ 307/272.1, 272.2, 307/286, 289, 290, 279, 494; 328/206, 207; 327/199, 200, 201, 202, 203, 208, 212, 195, 223, 224, 562, 563

[56] References Cited

U.S. PATENT DOCUMENTS

| | | | |
|---|---|---|---|
| 4,532,440 | 7/1985 | Barre | 307/272.1 |
| 5,049,760 | 9/1991 | Ooms | 307/279 |
| 5,049,761 | 9/1991 | Zitta | 307/494 |
| 5,055,720 | 10/1991 | Tiede | 307/279 |
| 5,103,117 | 4/1992 | Voorman et al. | 307/272.2 |
| 5,216,295 | 6/1993 | Hoang | 327/212 |

OTHER PUBLICATIONS

A. Dunlop et al., "A 9 Gbit/s Bandwidth Multiplexer/Demultiplexer CMOS Chip", 1992 Symposium on VLSI Circuits Digest of Technical Papers, pp. 68–69.

*Primary Examiner*—Timothy P. Callahan
*Assistant Examiner*—Eunja Shin
*Attorney, Agent, or Firm*—Sughrue, Mion, Zinn, Macpeak & Seas

[57] ABSTRACT

A flip-flop circuit which has a low power requirement and is capable of high-speed operation has first and second latch circuits having respective clock input terminals connected respectively to inverted- and normal-phase clock input terminals, a pair of differential data input terminals connected respectively to the differential signal input terminals of the first latch circuit, a pair of differential output terminals connected respectively to the differential signal output terminals of the second latch circuit, and a power supply and a current source, each connected to the first and second latch circuits. Each of the first and second latch circuits has first and second current mirror circuits energizable by the power supply, and first through fifth MOS transistors, each of the first and second latch circuits being of a dynamic type.

4 Claims, 2 Drawing Sheets

FLIP-FLOP CIRCUIT

BACKGROUND OF THE INVENTION

1. Field of the Invention

The present invention relates to a flip-flop circuit, and more particularly to a flip-flop circuit which is required to operate at high speed with low power consumption.

2. Description of the Related Art

Heretofore, a flip-flop circuit of the type described above is arranged as shown in FIG. 1 of the accompanying drawings.

As shown in FIG. 1, the flip-flop circuit has a pair of differential data input terminals 201, a normal-phase clock input terminal 202, an inverted-phase clock input terminal 203, a power supply 204, a pair of current sources 205, 206, a ground level 207, a pair of latch circuits 210, 211, and a pair of differential output terminals 212.

The differential data input terminals 201 are connected to respective differential signal input terminals of latch circuit 210. The normal-phase clock input terminal 202 and the inverted-phase clock input terminal 203, which serve as differential clock input terminals, are connected to respective differential clock input terminals of the latch circuits 210, 211. Specifically, the normal-phase clock input terminal 202 is connected to the normal-phase clock input terminal of latch circuit 210 and the inverted-phase clock input terminal of latch circuit 211, and the inverted-phase clock input terminal 203 is connected to the inverted-phase clock input terminal of latch circuit 210 and the normal-phase clock input terminal of latch circuit 211. The current sources 205, 206 are connected between current input terminals of the latch circuits 210, 211 and the ground level 207. Latch circuit 210 has differential signal output terminals connected to respective differential signal input terminals of latch circuit 211, whose differential signal output terminals are connected to the respective differential output terminals 212. The power supply 204 is connected between the ground level 207 and power supply input terminals of the respective latch circuits 210, 211.

Each of the latch circuits 210, 211 has a current mirror circuit 220, a current source 221, and a plurality of MOS transistors 222~227.

The differential signal input terminals, which are normal- and inverted-phase terminals, of latch circuit 210 are connected to the gates of MOS transistors 223, 222, respectively. The drain of MOS transistor 222 is connected to the gate of MOS transistor 224, the drain of MOS transistor 225, a first output terminal of the current mirror circuit 220, and one of the differential signal output terminals, which is an inverted-phase signal output terminal of latch circuit 210. The drain of MOS transistor 223 is connected to the gate of MOS transistor 225, the drain of MOS transistor 224, a second output terminal of the current mirror circuit 220, and the other of the differential signal output terminals, which is a normal-phase signal output terminal of latch circuit 210. MOS transistors 222, 223 have respective sources connected to the drain of MOS transistor 226, and MOS transistors 224, 225 have respective sources connected to the drain of MOS transistor 227. The gates of MOS transistors 226, 227 are connected to the inverted- and normal-phase clock input terminals, respectively, of latch circuit 210. The sources of MOS transistors 226, 227 are connected to the current input terminal of latch circuit 210. The current source 221 is coupled between an input terminal of the current mirror circuit 220 and the ground level 207. The power supply input terminal of the current mirror circuit 220 is connected to the power supply input terminal of latch circuit 210. Latch circuit 211 has the same circuit arrangement as latch circuit 210.

When the normal-phase clock input signal applied to latch circuit 210 is of a low level, input information supplied to the differential data input terminals 201 is written into the MOS transistors 222, 223 which are in a differential stage. When the normal-phase clock input signal applied to latch circuit 210 is of a high level, the information which has been written into the MOS transistors 222, 223 at the time the normal-phase clock input signal is of a low level is latched by the latch that is composed of MOS transistors 224, 225.

Since latch circuit 211 operates in the same manner as latch circuit 210, the latch circuits 210, 211 connected such that the normal- and inverted-phase clock input terminals of latch circuit 210 are connected respectively to the inverted- and normal-phase clock input terminals of latch circuit 211 can function as a flip-flop circuit.

The conventional flip-flop circuit has been disadvantageous in that the drains of MOS transistors 222, 223 in the differential stage of the first latch circuit 210 are connected to many loads, i.e., the output terminals of the current mirror circuit 220, the gates and drains of MOS transistors 224, 225, and the gates of the MOS transistors in the differential stage of the second latch circuit 211, imposing a limitation on high-speed operation of the flip-flop circuit. Another problem is that the power requirement of the flip-flop circuit is high because it has many current sources and a current flows at all times in the circuit.

SUMMARY OF THE INVENTION

It is therefore an object of the present invention to provide a flip-flop circuit which has a reduced power requirement and can operate at high speed.

According to the present invention, there is provided a flip-flop circuit comprising a inverted-phase clock input terminal, a first latch circuit having a clock input terminal connected to the inverted-phase clock input terminal, a pair of differential signal input terminals, and a pair of differential signal output terminals, a pair of differential data input terminals connected respectively to the differential signal input terminals of the first latch circuit, a normal-phase clock input terminal, a second latch circuit having a clock input terminal connected to the normal-phase clock input terminal, a pair of differential signal input terminals connected respectively to the differential signal output terminals of the first latch circuit, and a pair of differential signal output terminals, a pair of normal- and inverted-phase differential output terminals connected respectively to the differential signal output terminals of the second latch circuit, and a power supply and a current source, each connected to the first and second latch circuits, each of the first and second latch circuits comprising first and second current mirror circuits energizable by the power supply, and first through fifth MOS transistors, the first through fourth MOS transistors having respective sources connected in common to a drain of the fifth MOS transistor, the first and second MOS transistors having respective gates connected to the inverted-phase signal input terminal, the third and fourth MOS transistors having respective gates connected to the normal-phase signal input terminal, the first and fourth MOS transistors having respective drains connected to respective input terminals of the first and second current mirror circuits, the second MOS transistor having a drain connected to an output terminal of the second current mirror circuit and the normal-phase differential signal output terminal, the third MOS transistor having a drain connected to an output terminal of the first current mirror circuit and the inverted-phase differential signal output terminal, the fifth MOS transistor having a gate and a source connected respectively to the clock input terminal and a current input terminal which is connected to the current source.

Each of the first and second latch circuits operates in a dynamic fashion with a current that flows through the fifth MOS transistor only when the clock input signals are of a high level. Since each of the latch circuits is supplied with normal- and inverted-phase clock input signals, a current flows in only one of the latch circuits at a time, with the result that the flip-flop has a low power requirement.

The drains of the second and third MOS transistors, which are connected respectively to the normal- and inverted-phase signal output terminals of the first latch circuit, are connected to only the output terminals of the first and second current mirror circuits and the gates of the MOS transistors in an input stage of the second latch circuit. Consequently, the MOS transistors have fewer loads than in the conventional flip-flop circuit.

The above and other objects, features, and advantages of the present invention will become apparent from the following description when taken in conjunction with the accompanying drawings which illustrate a preferred embodiment of the present invention by way of example.

DETAILED DESCRIPTION OF THE PREFERRED EMBODIMENT

Figure 1:
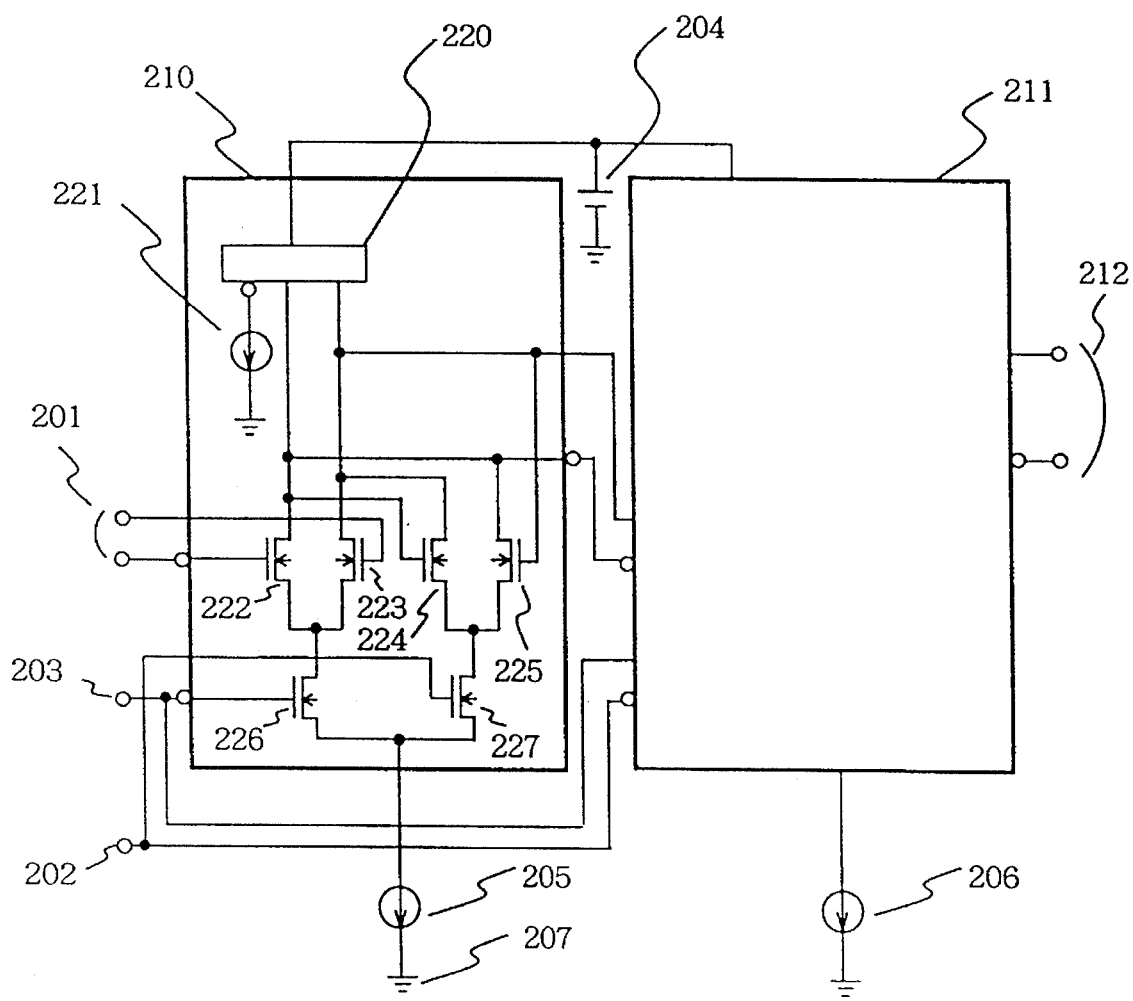
FIG. 1 is a block diagram of a conventional flip-flop circuit.
Figure 2:
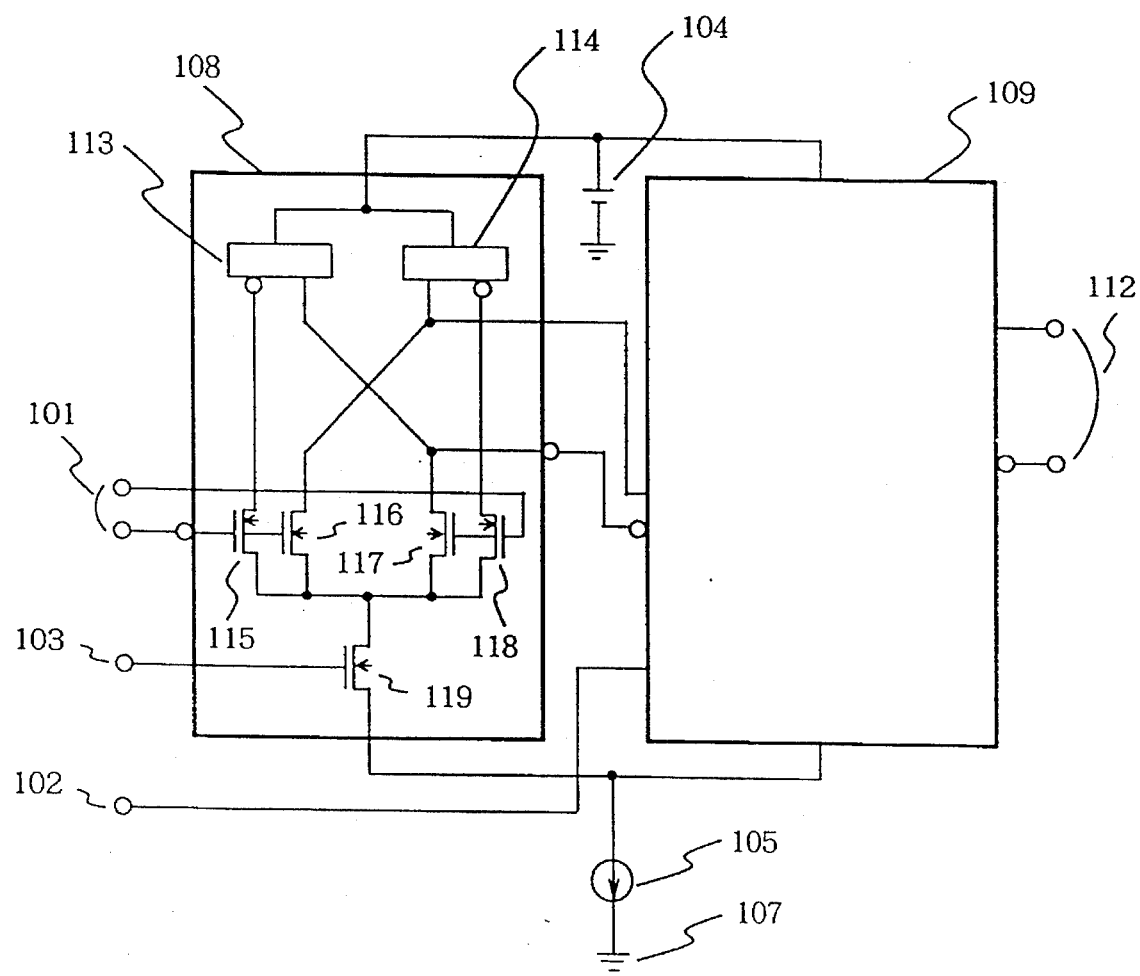
FIG. 2 is a block diagram of a flip-flop circuit according to the present invention.

As shown in FIG. 2, a flip-flop circuit according to the present invention has a pair of differential data input terminals 101, a normal-phase clock input terminal 102, an inverted-phase clock input terminal 103, a power supply 104, a current source 105, a ground level 107, a pair of latch circuits 108, 109, and a pair of differential output terminals 112.

The differential data input terminals 101 are connected to respective differential signal input terminals of a latch circuit 108. The normal-phase clock input terminal 102 and the inverted-phase clock input terminal 103 are connected to respective clock input terminals of latch circuits 109, 108. Latch circuit 108 has differential signal output terminals connected respectively to differential signal input terminals of latch circuit 109, whose differential signal output terminals are connected to the differential output terminals 112, respectively. The power supply 104 is connected between power supply input terminals of the latch circuits 108, 109 and the ground level 107. The current source 105 is connected between current input terminals of the latch circuits 108, 109 and the ground level 107.

Each of the latch circuits 108, 109 has a pair of current mirror circuits 113, 114 and a plurality of MOS transistors 115–119.

The differential signal input terminals, which are normal- and inverted-phase terminals, of latch circuit 108 are connected to MOS transistors 117, 118, 115, 116. The drains of MOS transistors 115, 118 are connected to respective input terminals of the current mirror circuits 113, 114. The drain of MOS transistor 116 is connected to an output terminal of current mirror circuit 114 and the normal-phase signal output terminal of latch circuit 108. The drain of MOS transistor 117 is connected to an output terminal of current mirror circuit 113 and the inverted-phase signal output terminal of latch circuit 108. MOS transistors 115–118 have respective sources connected to the drain of MOS transistor 119, whose gate and source are connected respectively to the clock input terminal 103 and the current input terminal of latch circuit 108. The current mirror circuits 113, 114 have respective power supply input terminals connected to the power supply input terminal of latch circuit 108. Latch circuit 109 has the same circuit arrangement as latch circuit 108.

Operation of the flip-flop circuit shown in FIG. 2 will be described below.

When the input signal applied to the inverted-phase clock input terminal 103 is of a high level and the normal-phase input signal applied to latch circuit 108 is of a high level, since MOS transistors 117, 118 are turned on and MOS transistors 115, 116 are turned off, the normal-phase output signal from latch circuit 108 is of a high level and the inverted-phase output signal from latch circuit 108 is of a low level.

When the input signal applied to the inverted-phase clock input terminal 103 is of a high level and the normal-phase input signal applied to latch circuit 108 is of a low level, since MOS transistors 117, 118 are turned off and MOS transistors 115, 116 are turned on, the normal-phase output signal from latch circuit 108 is of a low level and the inverted-phase output signal from latch circuit 108 is of a high level. When the input signal applied to the inverted-phase clock input terminal 103 subsequently goes low in level and no current flows to MOS transistor 119, since no current flows to a circuit which is composed of the current mirror circuits 113, 114 or MOS transistors 115–118, any information that has been written in latch circuit 108 remains unchanged even if the differential input signals vary, with the result that latch circuit 108 is in a latch mode for holding the written information.

Latch circuit 109 writes information in the same manner as latch circuit 108 when the input signal applied to the normal-phase clock input terminal 102 goes high in level, and enters a latch mode as with latch circuit 108 when the input signal applied to the normal-phase clock input terminal 102 goes low in level. The first latch circuit 108 and the second latch circuit 109 jointly function as a flip-flop circuit by supplying clock input signals in opposite phase to the first latch circuit 108 and the second latch circuit 109.

The flip-flop circuit according to the present invention is of a low power requirement because it is of a dynamic type in which almost no current flows in a latch mode.

The flip-flop circuit of the above arrangement offers the following advantages:

The flip-flop circuit can operate at high speed since the drains of the MOS transistors in the differential stage of the first latch circuit have few loads, i.e., they are connected to only the output terminals of the current mirror circuits and the gates of the MOS transistors in the differential stage of the second latch circuit. Because the latch circuits hold signals in a dynamic fashion, almost no current flows in the flip-flop circuit in a latch mode. Therefore, the flip-flop circuit according to the present invention is of a low power requirement.

Although a certain preferred embodiment of the present invention has been shown and described in detail, it should be understood that various changes and modifications may be made therein without departing from the scope of the appended claims.

What is claimed is:

1. A flip-flop circuit comprising:

an inverted-phase clock input terminal;

a first latch circuit having a clock input terminal connected to said inverted-phase clock input terminal, a pair of differential signal input terminals, and a pair of differential signal output terminals;

a pair of differential data input terminals connected respectively to the differential signal input terminals of said first latch circuit;

a normal-phase clock input terminal;

a second latch circuit having a clock input terminal connected to said normal-phase clock input terminal, a pair of differential signal input terminals connected respectively to the differential signal output terminals of said first latch circuit, and a pair of differential signal output terminals;

a pair of differential output terminals connected respectively to the differential signal output terminals of said second latch circuit; and a power supply and a current source, each connected to said first and second latch circuits;

each of said first and second latch circuits comprising first and second current mirror circuits energizable by said power supply and each of said first and second latch circuit being of a dynamic type.

2. A flip-flop circuit comprising:

an inverted-phase clock input terminal;

a first latch circuit having a clock input terminal connected to said inverted-phase clock input terminal, a pair of differential signal input terminals, and a pair of differential signal output terminals;

a pair of differential data input terminals connected respectively to the differential signal input terminals of said first latch circuit;

a normal-phase clock input terminal;

a second latch circuit having a clock input terminal connected to said normal-phase clock input terminal, a pair of differential signal input terminals connected respectively to the differential signal output terminals of said first latch circuit, and a pair of differential signal output terminals;

a pair of normal- and inverted-phase differential output terminals connected respectively to the differential signal output terminals of said second latch circuit; and a power supply and a current source, each connected to said first and second latch circuits;

each of said first and second latch circuits comprising first and second current mirror circuits energizable by said power supply, and first through fifth MOS transistors;

said first through fourth MOS transistors having respective sources connected in common to a drain of said fifth MOS transistor, said first and second MOS transistors having respective gates connected to the inverted-phase signal input terminal, said third and fourth MOS transistors having respective gates connected to the normal-phase signal input terminal, said first and fourth MOS transistors having respective drains connected to respective input terminals of said first and second current mirror circuits, said second MOS transistor having a drain connected to an output terminal of said second current mirror circuit and the normal-phase differential signal output terminal, said third MOS transistor having a drain connected to an output terminal of said first current mirror circuit and the inverted-phase differential signal output terminal, said fifth MOS transistor having a gate and a source connected respectively to the clock input terminal and a current input terminal which is connected to said current source.

3. The flip-flop circuit according to claim 1, wherein:

said first latch circuit further comprises first transistor means for storing and outputting information, wherein said first transistor means is connected to at least one of said first current mirror circuit and said second current mirror circuit of said first latch circuit, said clock input terminal of said first latch circuit, said pair of differential signal input terminals of said first latch circuit, and said pair of differential signal output terminals of said first latch circuit.

4. The flip-flop circuit according to claim 3, wherein:

said second latch circuit further comprises second transistor means for storing and outputting information, wherein said second transistor means is connected to at least one of said first current mirror circuit and said second current mirror circuit of said second latch circuit, said clock input terminal of said second latch circuit, said pair of differential signal input terminals of said second latch circuit, and said pair of differential signal output terminals of said second latch circuit.

* * * * *